(12) United States Patent
Schlaffer

(10) Patent No.: US 10,490,887 B2
(45) Date of Patent: Nov. 26, 2019

(54) PRINTED CIRCUIT BOARD PRODUCT WITH ANTENNA STRUCTURE AND METHOD FOR ITS PRODUCTION

(71) Applicant: AT&S AUSTRIA TECHNOLOGIE & SYSTEMTECHNIK AKTIENGESELLSCHAFT, Leoben (AT)

(72) Inventor: Erich Schlaffer, St. Lorenzen (AT)

(73) Assignee: AT&S AUSTRIA TECHNOLOGIE & SYSTEMTECHNIK AKTIENGESELLSCHAFT, Leoben (AT)

( * ) Notice: Subject to any disclaimer, the term of this patent is extended or adjusted under 35 U.S.C. 154(b) by 518 days.

(21) Appl. No.: 15/440,296

(22) Filed: Feb. 23, 2017

(65) Prior Publication Data

US 2017/0250466 A1  Aug. 31, 2017

(30) Foreign Application Priority Data

Feb. 29, 2016 (EP) ..................... 16157837

(51) Int. Cl.
*H01Q 1/38* (2006.01)
*H01Q 1/48* (2006.01)
(Continued)

(52) U.S. Cl.
CPC .......... *H01Q 1/38* (2013.01); *H01Q 1/48* (2013.01); *H05K 1/0222* (2013.01); *H05K 1/115* (2013.01);
(Continued)

(58) Field of Classification Search
USPC ......................................... 361/748
See application file for complete search history.

(56) References Cited

U.S. PATENT DOCUMENTS 6,739,048 B2 * 5/2004 Jones ............... H01L 21/4846
174/262
9,027,238 B2 * 5/2015 Ito ..................... H01L 23/5385
174/255
(Continued)

FOREIGN PATENT DOCUMENTS

WO  2007/130027 A1  11/2007

OTHER PUBLICATIONS

European Search Report issued in application No. 16157837.2, dated Aug. 31, 2016 (10 pages).
(Continued)

*Primary Examiner* — Andargie M Aychillhum
(74) *Attorney, Agent, or Firm* — Eversheds Sutherland (US) LLP

(57) ABSTRACT

A method for producing an intermediate printed circuit board product (80) with an antenna structure (5), including steps of providing a ground layer (10) including optionally a release layer (20) that is removably positioned (22) on an antenna subarea (12) of an exterior side (11) of the ground layer (10); attaching a dielectric insulating layer (30) on the exterior side (11) of the ground layer (10) that is if applicable partly covered by the release layer (20); attaching a conducting layer (40) on an exterior side (31) of the dielectric insulating layer (30); laminating of the layers (10, 20, 30, 40) to receive a first semi-finished product (50); manufacturing of an antenna cavity (60) throughout the conducting layer (40) and the dielectric insulating layer (30) with a ground-plane area (62) that is if applicable made up of the release layer (20); attaching a compound signal layer (70) on the conducting layer (40) covering the antenna cavity (60); and laminating of the layers (50, 70) to receive the intermediate product (80).

22 Claims, 9 Drawing Sheets

(51) Int. Cl.
*H05K 1/02* (2006.01)
*H05K 1/11* (2006.01)
*H05K 1/18* (2006.01)
*H05K 3/28* (2006.01)
*H05K 3/40* (2006.01)
*H05K 3/46* (2006.01)

(52) U.S. Cl.
CPC ............ *H05K 1/185* (2013.01); *H05K 3/282* (2013.01); *H05K 3/4038* (2013.01); *H05K 3/4644* (2013.01); *H05K 3/4697* (2013.01); H05K 2201/10098 (2013.01); H05K 2203/06 (2013.01)

(56) References Cited

U.S. PATENT DOCUMENTS

| 2012/0050125 A1 | 3/2012 | Leiba et al. |
| 2012/0212384 A1 | 8/2012 | Kam et al. |
| 2014/0138130 A1 | 5/2014 | Chang et al. |
| 2014/0216795 A1 | 8/2014 | Weichslberger et al. |

OTHER PUBLICATIONS

European Search Report issued in application No. 17158161.4, dated Jul. 4, 2017 (8 pages).

\* cited by examiner

PRINTED CIRCUIT BOARD PRODUCT WITH ANTENNA STRUCTURE AND METHOD FOR ITS PRODUCTION

The present invention relates to methods for producing an intermediate printed circuit board product with an antenna structure for high-frequency applications. The present invention also relates to an intermediate printed circuit board product as well as a printed circuit board with an antenna structure.

The selection of laminates for the fabrication of printed circuit boards (PCB's) typically available to designers is significantly reduced once operational frequencies increase to 500 MHz and above.

Disadvantageously standard laminate materials that are regularly used for low cost fabrication of printed circuit boards like FR-4-based laminates have comparably high relative permittivities with dielectric constants DC in the range approximately between 4.3 and 5.4. FR-4 (or FR4) is a grade designation assigned to glass-reinforced epoxy laminate sheets, tubes, rods and printed circuit boards (PCB). FR-4 denominates a composite material composed of woven fiberglass cloth with an epoxy resin binder that is flame resistant.

Due to high relative permittivities and dielectric constants, respectively, these basic laminates cannot be used for high-frequency applications like high-speed antennas and/or digital applications working at frequencies of 500 MHz and above, particularly for high-frequency applications at high frequencies of 30 GHz and above. For these high-frequency applications so-called RF laminates (RF short for Radio Frequency) are required with low dielectric loss as well as conductor loss for improved insertion loss and signal integrity while maintaining all other desirable attributes of the standard laminates. Such RF laminates like PTFE (PolyTetraFluoroEthylene, Teflon®)-based materials or hydrocarbon ceramic laminates are designed to offer superior high frequency performance but are very expensive. Also the process efforts and process costs in PCB manufacturing are very high when these RF laminates are applied.

In telecommunication, there are several types of microstrip antennas that are also known as printed antennas. The most common of which is the micros trip patch antenna or patch antenna, respectively. A patch antenna that is also known as a rectangular microstrip antenna is a type of radio antenna with a low profile, which can be mounted on a flat surface. Commonly it consists of a flat rectangular sheet or patch of metal or a conductive material, mounted over a larger sheet of metal called a ground plane. The assembly is usually contained inside a housing like a plastic radome, which protects the antenna structure from damage. Patch antennas are simple to fabricate and easy to modify and customize. They are the original type of microstrip antenna wherein the two metal sheets together form a resonant piece of micros trip transmission line with a length of approximately one-half wavelength of the radio waves. The radiation mechanism arises from discontinuities at each truncated edge of the microstrip transmission line. The radiation at the edges causes the antenna to act slightly larger electrically than its physical dimensions, so in order for the antenna to be resonant, a length of microstrip transmission line slightly shorter than one-half a wavelength at the frequency is used. A patch antenna is usually constructed on a dielectric substrate, using the same materials and lithography processes used to make printed circuit boards. For example the documents EP 1 501 155 A1, JP 2002-151911 A, JP 1996-111609 A and WO 2008/102950 A1 show different embodiments of these antennas.

Document U.S. Pat. No. 5,444,453 A discloses a microstrip antenna structure having an air gap between a radiator patch that is affixed on an inside of a thin substrate layer and a ground plane. The radiator patch made of a conductive material is attached the thin substrate layer made of a dielectric material forming a radiator layer. To maintain a substantially uniform air gap between the radiator patch and the ground plane several support posts of a predetermined thickness as well as of the same, dimple shape have to be arranged between the radiator layer and the ground layer. Thus the disadvantages of dielectric basic materials with a low dielectric constant like PTFE (Teflon®) that are frequently used in microstrip antenna systems can be overcome as air with a very low dielectric constant DC of 1.0 is arranged between the radiator layer and the ground layer.

Disadvantageously the method of U.S. Pat. No. 5,444,453 A for producing such a microstrip antenna structure is expensive as well as labour-intensive as a rigid radiator layer including a substrate layer with radiator patches affixed thereto has to be provided and connected with a ground plane layer via a plurality of support posts that have to be arranged between the two layers to ensure the constant air gap width. The support posts have to be formed for example by punching the bottom face of the ground plane with a die thereby deforming the ground plane and resulting in a plurality of protrusions of ground plane material.

In another document US 2012/0212384 A1 a chip package is shown that includes a plurality of layers including conductive planes connected by vias. The layers include a first portion with an antenna formed therein and a parallel-plate mode suppression mechanism to suppress parallel-plate mode excitation of the antenna. The parallel-plate mode suppression mechanism includes a reflector between an antenna cavity and a ground plane that separates the first portion from a second portion of layers. On the inner side of the antenna cavity a patch antenna is mounted. On the ground plane an integrated circuit device is surface mounted. Disadvantageously the build-up of this chip package is complicated and—as the reflector is positioned offset from the antenna—is not adapted to the usage of standard laminate materials that are regularly used for low cost fabrication of printed circuit boards like FR-4-based laminates. Another disadvantage are long signal line paths as the IC device is mounted on the opposite ground plane side of the antenna.

Thus an object of the present invention is to provide an improved method to construct an antenna structure for high speed or respective high frequency applications that can be realized at a highest-possible share with laminate materials like FR-4-based laminates which are used in standard PCB production and which have the benefit of high uptime as well as low raw material costs.

Another, more specific object of the present invention is to provide an improved construction method for the aforementioned antenna structures wherein—compared with a default PCB production process—no additional process steps or auxiliary tools for process equipment are required.

A further object of the present invention is to provide a method for producing an intermediate printed circuit board product or a printed circuit board with an antenna structure, wherein the antenna or microstrip antenna structure and the digital application are arranged within the same printed circuit board, preferably within the same layers of the PCB, to avoid additional physical connectors like cables between an antenna area and a digital application area.

Another aim of the present invention is to preferably avoid usage of expensive RF laminates like PTFE-based materials or hydrocarbon ceramic laminates to achieve superior high frequency performance for high-frequency applications when producing an intermediate printed circuit board product or a printed circuit board, respectively.

A further, even more specific aim of the present invention is to decouple required Radio Frequency (RF) properties of the antenna structure from the material properties of the laminates used to build up the antenna structure.

The afore-mentioned objects are solved within the present invention by providing a method for producing an intermediate printed circuit board product with an antenna structure with the features of claim 1—or alternatively—with the features of claim 2. Other advantageous embodiments of the invention are presented in the dependent method claims.

A first method for producing an intermediate printed circuit board product with an antenna structure according to the invention comprises the following steps:

Providing a ground layer;
  Optionally attaching a release layer with a release layer shape on one exterior side of the ground layer wherein the release layer is removably positioned on an antenna subarea of the exterior side of the ground layer;
Attaching a dielectric insulating layer on one exterior side of the ground layer that is if applicable partly covered by the release layer wherein the release layer is arranged between the ground layer and the dielectric insulating layer;
Attaching a conducting layer on a first exterior side of the dielectric insulating layer opposite to the ground layer wherein the dielectric insulating layer is arranged between the conducting layer and the ground layer;
Laminating of the ground layer, the at least one dielectric insulating layer, the at least one conducting layer and if applicable the release layer, and
  Optionally attaching a layer arrangement on a first exterior side of said conducting layer, said layer arrangement comprising at least one further dielectric insulating layer and at least one further conducting layer, whereby at least one further dielectric insulating layer is attached on said first exterior side of the preceding conducting layer and at least one further conducting layer is attached on a first exterior side of at least one further dielectric insulating layer, to obtain a first semi-finished product;
Manufacturing of at least one antenna cavity within the first semi-finished product starting on its exterior side that is made up of the at least one conducting layer and extending throughout at least one conducting layer as well as at least one dielectric insulating layer with a cavity height equal to the sum of at least one conducting layer height and at least one dielectric insulating layer height, wherein if applicable a cavity projection area corresponds to the release layer shape and is positioned on the antenna subarea covered by the release layer and wherein a ground-plane area of the cavity is made up of the release layer;
  Optionally coating of the side walls within the antenna cavity;
Attaching a compound signal layer on the exterior side made up of the conducting layer of the first semi-finished product, wherein the compound signal layer covers the antenna cavity;
Laminating of the first semi-finished product and the compound signal layer to obtain an intermediate printed circuit board product.

Advantageously with the aforesaid inventive production method an antenna cavity of an antenna structure can be integrated within an intermediate printed circuit board product made of standardized laminate stack materials. The at least one antenna cavity within the PCB is filled with air that shows best conditions for low insertion and transmission losses due to its low dielectric constant DC of 1.0. Thus the stacked-up layers made of standard laminate material like FR-4 laminate sheets and/or conducting layers exemplarily made of copper that cover the antenna cavity on its both opposite sides contribute only with a small share to the total relative permittivity of the printed circuit board.

To the best advantage the respective relative permittivities of the dielectric laminates applied have comparably minor relevance or no relevance, respectively, in order to achieve superior high frequency performance of the antenna structure for high-frequency applications. Thus the properties of the dielectric laminate material can be selected and optimized according to individual target parameters of the respective application, for example to optimize heat management targets of the dielectric material or for economic targets to use cheap and readily available materials. With the inventive production method material selection of dielectric materials is no longer a compromise between Radio Frequency (RF) and other applications but can be optimized for any other purpose which is a major advantage of the invention that enhances flexibility of the respective production method decisively.

Manufacturing of the antenna cavity within the first semi-finished product can be made for example via a laser cutting-, punching-, etching- and/or deep routing process. Depending on the precision that is required to obtain an antenna cavity with exact outlines, usage of a release layer that is attached on the ground layer and that defines the shape of the antenna subarea, can be of advantage. Thus a cavity projection area that corresponds to the release layer shape can be obtained, wherein the ground-plane area of the cavity is covered by the release layer. After manufacturing the antenna cavity it can be opened like a plug by peeling off the release layer. This manufacturing feature is also known as 2.5D technology developed by the applicant.

Advantageously the depth of the antenna cavity is flexible and can be adapted according to individual requirements. In order to meet a very low dissipation factor (DF) which is a measure of loss-rate of energy of a mode of mechanical, electrical, or electromechanical oscillation in a dissipative system, the depth of the antenna cavity can be adjusted in relation to the inductance of a patch antenna. Also the antenna design area can be adjusted in relation to the depth of the cavity which is another advantage of the invention.

Depending on the number of conducting layers and dielectric insulating layers that are usually stacked pairwise, the antenna cavity height can be adjusted equal to the sum of at least one conducting layer height and at least one dielectric insulating layer height. If applicable a cavity projection area corresponds to the release layer shape and is positioned on the antenna subarea covered by the release layer and wherein a ground-plane area of the cavity is made up of the release layer.

As an option also a layer arrangement comprising at least one further dielectric insulating layer and at least one further conducting layer can be attached to or stacked up on said conducting layer. The layer arrangement can comprise even or uneven numbers of layers. The layer arrangement can comprise for example in one embodiment further dielectric insulating layers and further conducting layers that are alternatingly and pairwise positioned within the layer arrangement. In another embodiment said layer arrangement can also comprise two or more further dielectric insulating layers that are stacked up directly next to one another forming a multi-layered dielectric insulating layer arrangement, before a further conducting layer is arranged. Thus also asymmetrical layer build-ups are covered by said layer arrangement. According to the number of layers comprised within the layer arrangement and their respective layer heights, the cavity height of the antenna cavity can be adjusted.

Advantageously side walls within the air gap of the antenna cavity can be covered with a coating. A metallic coating of the side walls works as metalized shielding which increases antenna signal reflection and reduces signal losses. Metallic coating can also shield any digital processing structure that is arranged on board and prevent or at least reduce the risk of electric and electrostatic discharges within the PCB. For example copper or other metals that are regularly used for immersion coating endsurface processes like nickel, gold, tin and/or silver can be used as metal coating materials.

For the sake of completeness it is mentioned that in principle different materials can be used as electrically insulating material. Mainly reinforced or unreinforced resins or epoxy resins, respectively, like FR-4 or FR-5 laminate sheets, are used. Alternatively or in addition also insulating materials made of Teflon®, polyamide, polyimide, cyanate ester and/or Bismaleimide-Triazine (BT) resin, as well as glasses or glass-like carrier materials like multilayer glass, or also ceramics can be used as insulating materials.

In an alternative embodiment of the invention a method for producing an intermediate printed circuit board product with an antenna structure can be indicated comprising the following steps:

Providing a ground layer;

Attaching a dielectric insulating layer on one exterior side of the ground layer, wherein the dielectric insulating layer has at least one recess extending throughout the dielectric insulating layer height of the dielectric insulating layer, and wherein the at least one recess is positioned on an antenna subarea of the exterior side of the ground layer;

Attaching a conducting layer on a first exterior side of the dielectric insulating layer opposite to the ground layer, wherein the dielectric insulating layer is arranged between the conducting layer and the ground layer, and wherein the conducting layer preferably has at least one recess extending throughout the conducting layer height of the conducting layer which at least one recess is positioned coextensive with the at least one recess of the dielectric insulating layer;

Laminating of the ground layer, the at least one dielectric insulating layer and the at least one conducting layer, and Optionally attaching a layer arrangement on a first exterior side of said conducting layer, said layer arrangement comprising at least one further dielectric insulating layer and at least one further conducting layer, whereby at least one further dielectric insulating layer is attached on said first exterior side of the conducting layer and at least one further conducting layer is attached on a first exterior side of at least one further dielectric insulating layer, and wherein preferably at least one further dielectric insulating layer and at least one further conducting layer has at least one recess that is positioned in registry with at least one of the preceding recesses as well as in registry with an antenna subarea on the exterior side of the ground layer, to obtain a first semi-finished product;

Receiving at least one antenna cavity within the first semi-finished product starting on its exterior side that is made up of the recess of at least one conducting layer as well as the coextensive recess of at least one dielectric insulating layer, the at least one antenna cavity comprising a cavity height equal to the sum of at least one conducting layer height and at least one dielectric insulating layer height, wherein a cavity projection area of the antenna cavity is positioned on the antenna subarea;

Optionally coating of the side walls within the antenna cavity;

Attaching a compound signal layer on the exterior side made up of the conducting layer of the first semi-finished product, wherein the compound signal layer covers the at least one antenna cavity;

Laminating of the first semi-finished product and the compound signal layer to obtain an intermediate printed circuit board product.

The aforesaid alternative method for producing an intermediate printed circuit board provides the advantage that the at least one antenna cavity can be pre-formed via recesses within the one or more dielectric insulating layer as well as within the one or more conducting layer. Advantageously in this case so called "no-flow" or "low-flow", respectively, materials are used as insulating layer and/or conducting layer. Low-flow prepregs are prepregs which are modified to reduce or limit their resin flow during lamination and hardening. Thus cut-out areas or recesses, respectively, can be realised within these materials that cannot tolerate resin flowing in. Where appropriate, manufacturing of the recesses within the layers can be made for example via a laser cutting-, punching-, etching- and/or deep routing process. To enhance the precision of antenna cavity manufacture it is important that recesses within the respective insulating layers and conducting layers are positioned coextensive with other corresponding recesses. Further on the corresponding recesses shall also be in registry with a corresponding antenna subarea on an exterior side of the ground layer. For an antenna cavity that has recesses within different stacked layers that are precisely in registry with each other, it is also easier to optionally coat the side walls within the antenna cavity with a metalized shielding which increases antenna signal reflection and reduces signal losses.

Within the scope of the invention it is also possible to attach conducting layers and/or insulating layers without pre-built recesses that firstly cover the respective recesses of a dielectric insulating layer underneath. The recesses within the conducting layers and/or insulating layers that have to be in registry with the respective recesses of the dielectric insulating layers beneath can be manufactured also on the spot via a material-removal process like milling.

Particularly advantageous for a method according to the invention the compound signal layer can comprise a dielectric no-flow prepreg layer and a conducting metal layer that is directly attached to the dielectric no-flow prepreg layer wherein the dielectric no-flow prepreg layer is attached to the conducting layer of the first semi-finished product. In this advantageous embodiment the compound signal layer comprising two layers is provided in advance before attaching it on the exterior side made up of the conducting layer of the first semi-finished product to cover the antenna cavity. Thus the dielectric no-flow prepreg layer covering the antenna cavity provides a flat surface to carry the antenna structure. Advantageously the compound signal layer can be prepared before laminating it to obtain an intermediate printed circuit board product. Preferably the conducting metal layer, which is attached to the dielectric no-flow prepreg layer, is recessed in cavity projection areas where one or several antenna cavities are located beneath. Also of advantage is that the dielectric no-flow prepreg layer keeps its flat surface also during lamination in that region where it serves as antenna cavity cover.

In a further practical embodiment of the inventive method the ground layer can be made of a laminated compound layer comprising at least two conducting metal layers laminated with an insulating layer in between the at least two conducting metal layers. Usage of a pre-laminated compound layer as ground layer improves production handling and reduces production costs. Optionally a layer arrangement comprising at least one further insulating layer and at least one further conducting metal layer can be stacked up and laminated with the preceding layers to form the laminated compound layer. These further layers can be laminated in one single lamination step or alternatively in two or more separate lamination steps to receive a laminated compound layer that serves as ground layer according to the invention. Preferably one or several pairs of a further insulating layer and a further conducting metal layer can be stacked alternately and can be laminated with the preceding layers to form the laminated compound layer or ground layer, respectively. In another preferred embodiment also an asymmetrical layer build-up is possible wherein for example two or more insulating layers can be stacked up directly next to one another.

Usefully in an embodiment of a production method according to the invention the antenna cavity can have a vent through-hole arranged between the ground-plane area of the cavity and an exterior side of the intermediate printed circuit board product. In this embodiment the vent through-hole ensures that a pressure compensation can take place between the inside pressure within the antenna cavity and the surrounding pressure outside of the PCB.

In a preferred realisation of the inventive method the antenna cavity can be surrounded with shielding vias that are arranged within the laminated ground layer and/or at least one dielectric insulating layer and/or conducting layer and/or compound signal layer in a distance in regard to the antenna cavity. Shielding vias act as electric screen to shield the antenna structure and the antenna cavity, respectively, from electric and electrostatic discharges within the PCB. Also of advantage is that the shielding vias enhance the mechanical strength of the intermediate printed circuit board product or the printed circuit board, respectively. Particularly of advantage is when the shielding vias are positioned in extension to the corners of the at least one antenna cavity.

In a further preferred embodiment of the inventive method the antenna structure can comprise an antenna design area that is arranged on an exterior side of the compound signal layer. Preferably the antenna design area is attached on the dielectric no-flow prepreg layer as this layer provides a flat surface and covers the antenna cavity located beneath. In an especially preferred embodiment the antenna design area is attached on the upper exterior side of the dielectric no-flow prepreg layer.

In a preferred embodiment the antenna structure with one or several antenna design areas is realized on the upper exterior side of the dielectric no-flow prepreg layer that is part of the compound signal layer. The at least one antenna design area may comprise an antenna structure, for example with micro-vias of a travelling wave antenna with a main line and several open stubs being arranged in a way that the open stubs end well before the side walls of the antenna cavity that is located underneath. An antenna signal line is required that connects the antenna design area with a signal processing unit that is preferably arranged on the same printed circuit board.

Advantageously in another preferred embodiment of the inventive method a digital processing area with a digital processing structure that comprises at least one signal processing unit is surface-mounted on or embedded within the intermediate printed circuit board product in a distance in regard to the antenna cavity. The signal processing unit is connected via at least one antenna signal line with the antenna structure and is designed for analogue and digital signal processing of antenna signals. Thus an antenna structure and a digital processing structure for digital processing are arranged within the same printed circuit board, preferably within the same layers of the printed circuit board. Advantageously no additional physical connectors like cables are required for processing of digital applications. In a preferred embodiment where the antenna structure and the digital processing structure are arranged within the same layers, advantageously antenna signal lines can be designed along shortest routes between the respective structures to avoid signal losses due to the high frequency antenna signals.

To give an example the digital processing structure can comprise a signal processing unit with a radio frequency integrated circuit (RFIC) chip that is already known in the art. Applications for RFICs include radar and communications, although the term RFIC might be applied to any integrated electrical circuit. The signal processing unit is designed for analogue and digital signal processing of antenna signals and may further comprise at least one radio frequency (RF) mixer that can be integrated as a component within the RFIC-chip or can be a separate component. A frequency mixer can be used to convert a high-frequency antenna signal to a medium-frequency signal that can be processed further in the signal processing unit. The signal processing unit can further comprise at least one filter, AD converter, decoder, amplifier, memory unit and/or power supply unit. The signal processing unit is connected via at least one antenna signal line with the antenna structure. The antenna signal line has to be adapted for high frequency antenna signals. For example a microstrip line can be used as antenna signal line. With the aforesaid embodiment of a digital processing structure several electrical functions can be realized by the circuitry according to the invention.

Particularly for high-frequency applications with signal frequencies of approximately 30 GHz and above, it is of advantage to use a RF laminate layer to position the antenna design area and preferably also the antenna signal line thereon. A RF laminate layer is made for example of materials like PTFE-based materials or hydrocarbon ceramic laminates with low dissipation factor DF and also very low dielectric constant DC. Such RF laminate layers are adapted for high-frequency applications and help to further enhance the antenna performance. To give examples of established types and brands of RF laminate materials, for example Megtron 6 and Megtron 7 materials of Panasonic, EM888 material of EMC, Pyralux TK laminate of Du Pont and laminates RO 3003 and RO 4830 of Rogers can be used for the build-up of a signal compound layer within the scope of the invention. Other antenna embodiments known in the art usually are designed in a way that their build-up requires usage of several RF laminate layers what is expensive. Advantageously according to the inventive build-up, usage of a single RF laminate layer already can enhance the antenna performance, as well as the antenna signal transmission between the antenna design area and the signal processing unit, significantly.

Particularly convenient is a method according to the invention wherein the digital processing structure can comprise one or more plated through holes (PTH) passing through the intermediate printed circuit board product from a first exterior side of the intermediate printed circuit board product to an opposite second exterior side. Thus for example a radio frequency integrated circuit (RFIC) chip that is part of the signal processing unit can be surface-mounted on one side of the intermediate printed circuit board product and can be connected via plated through holes with any layer including the ground layer on the opposite exterior side of the board.

The aforesaid varieties of methods according to the invention can also be used to receive a printed circuit. Advantageously for this purpose solder masks are affixed on one or both exterior sides of one intermediate printed circuit board product or on one or both exterior sides of at least two previously interconnected and stacked-up intermediate printed circuit board products. Structured solder layers can be applied within recesses of the solder masks. Optionally the solder masks can be removed.

In case two or more intermediate printed circuit board products are stacked-up to receive a multi-layered printed circuit board, it is obvious for the skilled person that if any vent through-hole is arranged between the ground-plane area of the antenna cavity and an exterior side of a first intermediate printed circuit board product, it may be necessary to extend the vent through-hole also throughout the interconnected further intermediate printed circuit board products right up to an outer surface of the printed circuit board.

The same may be true if any digital processing area is realised comprising a digital processing structure. Thus in case several intermediate printed circuit board products are stacked-up it may be necessary to embed components of the signal processing unit like for example to embed a RFIC-chip. It may also be of advantage to design respective antenna signal lines that are at least partly arranged on the same level of structured conducting layers.

In another embodiment where further layers are stacked up on top of the antenna structure it may be necessary to cut out these further layers in the projection of the antenna cavities and the corresponding antenna structures to avoid that respective antenna design areas are covered by these further layers. Or, in other words, the antenna structures can be surrounded by further stacked-up layers as long as these further layers have recesses in the cavity projection areas of the antenna cavities.

When stacking up two or more intermediate printed circuit board products it may also be of advantage if applicable to extend plated through holes passing through a first intermediate printed circuit board product into one or more interconnected further intermediate printed circuit board products accordingly.

In a further preferred embodiment of the inventive method at least one component is embedded within the layers of the intermediate printed circuit board product.

The component may be selected from a group consisting of an electrical non-conductive inlay, an electrical conductive inlay such as a metal inlay that preferably comprises copper or aluminium, a heat transfer unit for example a heat pipe, a light guiding element for example an optical waveguide or a light conductor connection, an electronic component or combinations thereof.

The electronic component may be selected from a group consisting of an active electronic component, a passive electronic component, an electronic chip, a storage device e.g. a DRAM or other data memories, a filter, an integrated circuit, a signal processing component, a power management component, an optoelectronic interface element, a voltage converter e.g. a DC/DC converter or AC/DC converter, a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip and an energy harvesting unit. However, other electronic components may be embedded in the electronic device. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element. Such an electronic component may be surface-mounted on the component carrier and/or may be embedded in an interior thereof. However, also other electronic components, in particular those which generate and emit electromagnetic radiation and/or are sensitive with regard to electro-magnetic radiation propagating to the electronic component from an environment, may be used for the described electric in the electronic system.

Each active electronic component like for example an electronic chip, especially a flip chip, or each passive electronic component like a capacitor, a resistor, an inductance or any magnetic element like a magnetic ferrite core can be understood as electronic component according to the invention that can be embedded within the intermediate printed circuit board product. Further examples for embedded electronic components are data storage devices like a dynamic random access memory (DRAM), filters that can be configured for example as high-pass filter, low-pass filter or band-pass filter or that can be used as frequency filters. Also an integrated circuit (IC) like a so-called logic IC, any signal processing component like a microprocessor, any performance management component, any opto-electronic device, any voltage converter like a DC/DC-converter or AC/DC-converter, any electromechanical converter like a lead-zirconium titanate (PZT)-sensor and/or -actor, as well as any sender unit or receiving unit for electromagnetic waves like a RFID-chip or -transponder, any cryptographic component, capacity, inductivity or switch like a transistor-based switch are comprised alone or combined with the aforementioned or together with other functional electronic components by the aforesaid term of an electronic component to be embedded. Furthermore the electronic component can also comprise a microelectromechanical system (short MEMS), a battery, an accumulator, a camera or an antenna.

The afore-mentioned tasks are also solved within the present invention by providing an intermediate printed circuit board product with an antenna structure with the features of the characterising part of claim 10. Other advantageous embodiments of the invention are also presented in the dependent product claims.

According to the invention an intermediate printed circuit board structure with an antenna structure features at least one antenna cavity that is arranged within a first semi-finished product comprising at least one ground layer, at least one dielectric insulating layer which is attached to the ground layer and at least one conducting layer which is attached to the dielectric insulating layer opposite to the ground layer in a way that the at least one dielectric insulating layer is arranged between the at least one conducting layer and the ground layer, whereby the ground layer, the at least one dielectric insulating layer and the at least one conducting layer are laminated, and wherein the antenna cavity touches the ground layer alongside a ground-plane area and extends throughout the at least one conducting layer as well as the at least one dielectric insulating layer with a cavity height equal to the sum of at least one conducting layer height and of at least one dielectric insulating layer height, wherein a compound signal layer is attached on the conducting layer of the first semi-finished product covering the antenna cavity, and the first semi-finished product and the compound signal layer are laminated.

Advantageously an intermediate printed circuit board product according to the invention that comprises an antenna structure is built up of laminated semi-finished products that are themselves built up by standardized laminate stack materials and/or by conducting layers. The at least one antenna cavity within the intermediate printed circuit board or later PCB, respectively, is filled with air that shows best conditions for low insertion and transmission losses due to its low dielectric constant DC of 1.0. The stacked-up layers made of standard laminate material like FR-4 laminate sheets and/or by conducting layers exemplarily made of copper that cover the antenna cavity on its both opposite sides contribute only with a small share to the total relative permittivity of the printed circuit board. Thus the printed circuit board can be produced at low production costs with standard PCB manufacturing equipment due to the usage of standard stack-up materials that are regularly applied in PCB production. Due to the fact that air is within the antenna cavity the overall permittivity of the PCB can be kept low and thus the efficiency of high speed transmission can be improved. Although applied standard materials show relatively high dielectric constants and high permittivity, respectively.

In another preferred embodiment of the invention the antenna cavity can be surrounded with shielding vias that are arranged within the ground layer and/or dielectric insulating layer and/or conducting layer and/or compound signal layer in a distance to the antenna cavity.

Shielding vias act as electric screen to shield the antenna structure and the antenna cavity, respectively. Particularly of advantage is that shielding vias also enhance the mechanical strength of the intermediate printed circuit board product or the printed circuit board, respectively, especially in vicinity to the antenna cavity. In a preferred embodiment of the invention shielding vias are positioned in extension to the corners of the at least one antenna cavity.

Also of advantage is that the antenna cavity within the first semi-finished product can be manufactured for example via a laser cutting-, punching-, etching- and/or deep routing process.

In a further practical embodiment of the invention an intermediate printed circuit board product can comprise a compound signal layer with a dielectric no-flow prepreg layer and a conducting metal layer directly attached to the dielectric no-flow prepreg layer wherein the dielectric no-flow prepreg layer is attached to a conducting layer of the first semi-finished product. In this advantageous embodiment the compound signal layer comprising two layers is provided in advance before attaching it on the exterior side made up of the conducting layer of the first semi-finished product to cover the antenna cavity. The dielectric no-flow prepreg layer has the advantage to provide a flat surface for the antenna design area.

Usefully an intermediate printed circuit board product according to the invention can comprise a digital processing area with a digital processing structure comprising at least one signal processing unit that is mounted on or embedded within the intermediate printed circuit board product in a distance to the antenna cavity. The signal processing unit is connected via at least one antenna signal line with the antenna structure that is designed for analogue and digital signal processing of antenna signals. The antenna signal line is adapted for transmission of high frequency antenna signals. For example a microstrip line can be used as antenna signal line.

The signal processing unit can comprise a radio frequency integrated circuit (RFIC) chip that is already known in the art. The signal processing unit is designed for analogue and digital signal processing of antenna signals and may further comprise at least one radio frequency (RF) mixer that can be integrated as a component within the RFIC-chip or can be a separate component. The signal processing unit can further comprise at least one filter, AD converter, decoder, amplifier, memory unit and/or power supply unit. Several electrical functions can be realized by the circuitry according to the invention.

For embodiments with embedded components of the signal processing unit like an embedded RFIC-chip, these parts or components can be arranged within the laminated ground layer and/or at least one laminated dielectric insulating layer and/or at least one conducting layer and/or compound signal layer in a distance to the antenna cavity. Thus an antenna structure and a digital processing structure for digital signal processing are advantageously arranged within the same printed circuit board, preferably within the same layers of the printed circuit board. Thus antenna signal lines can be designed along shortest paths between the antenna design area and the signal processing unit to avoid signal losses.

The same is valid for an embodiment with a surface-mounted signal processing unit, where for example a RFIC-chip is surface mounted. Also in this case it is preferred to arrange the antenna structure and the respective digital processing structure for digital signal processing within the same layers of the printed circuit board to be able to keep the connecting antenna signal line paths short.

Usefully an intermediate printed circuit board product can have at least one antenna cavity with a vent through-hole starting from the ground-plane area of the antenna cavity and passing throughout the laminated ground layer to enhance pressure compensation between the inside pressure within the antenna cavity and the surrounding pressure outside of the intermediate printed circuit board product or a PCB, respectively.

In a further embodiment of the invention the intermediate printed circuit board product can comprise at least one component that is embedded within the layers of the intermediate printed circuit board product.

In another development of the invention a printed circuit board with an antenna structure can be indicated comprising at least one intermediate printed circuit board product wherein a solder mask is applied on one or both exterior sides of one intermediate printed circuit board product or on one or both exterior sides of at least two previously interconnected and stacked-up intermediate printed circuit board products. Optionally the outer surfaces are finished before to receive the printed circuit board. The aforesaid advantages of an intermediate printed circuit board product apply equivalently also for a printed circuit board according to the invention.

Other objects, advantages, and novel features of the present invention will become more apparent from the following detailed description when taken in conjunction with the accompanying schematic drawings.

Figure 3A:
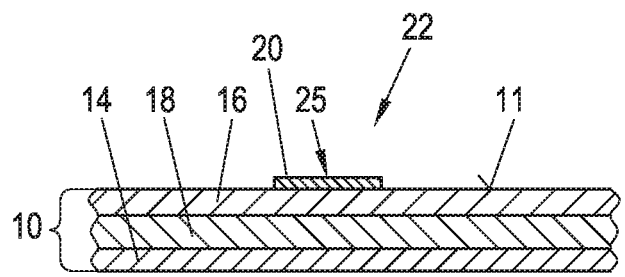
Figure 4A:
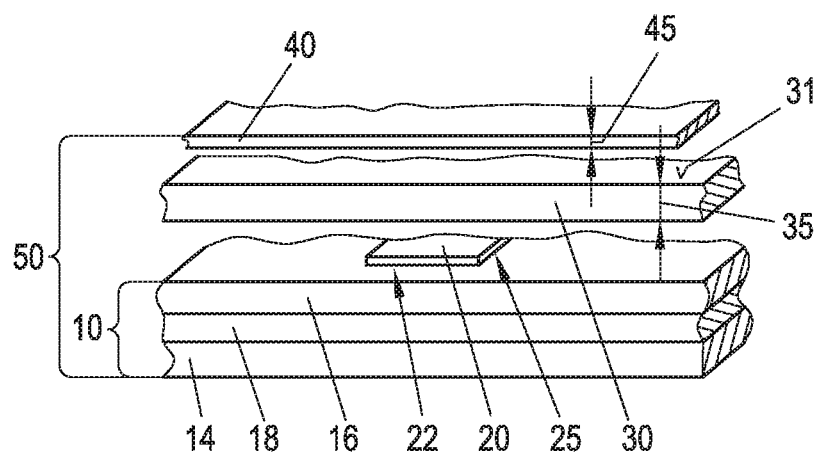
Figure 3B:
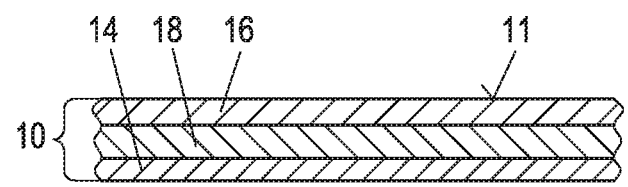
Figure 4B:
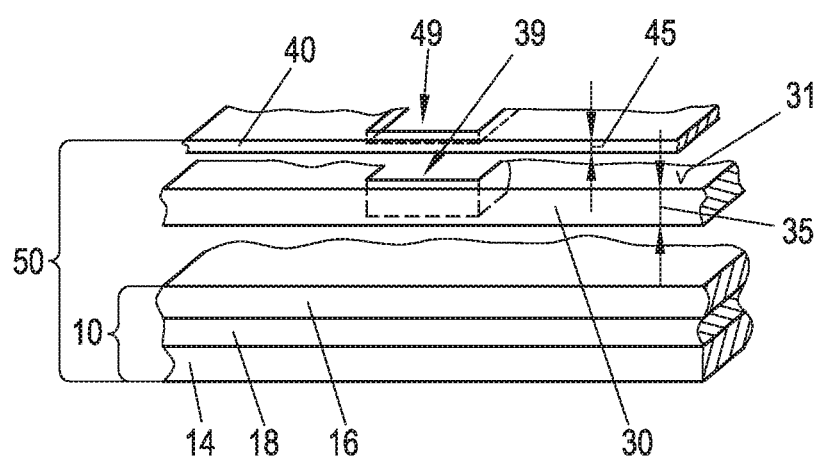
Figure 5:
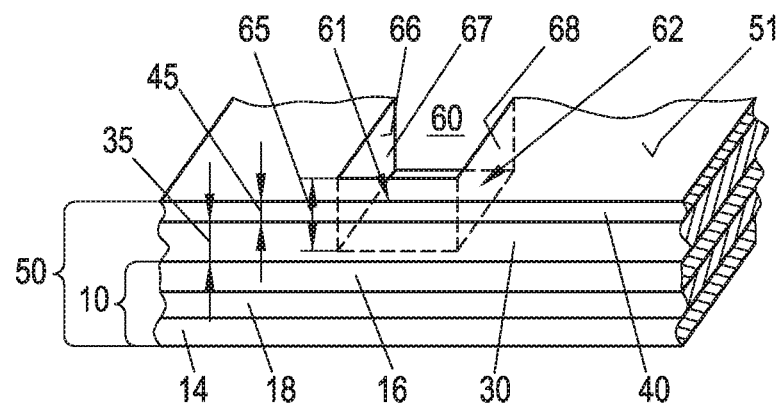
Figure 6:
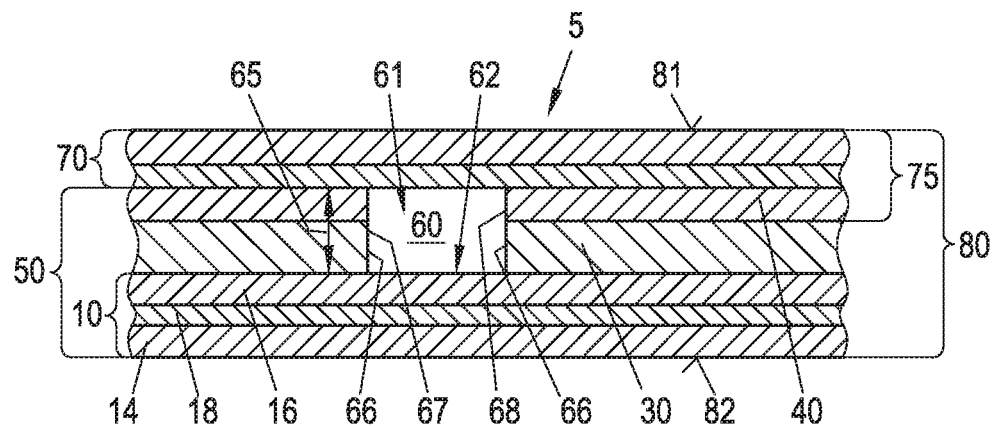
Figure 7:
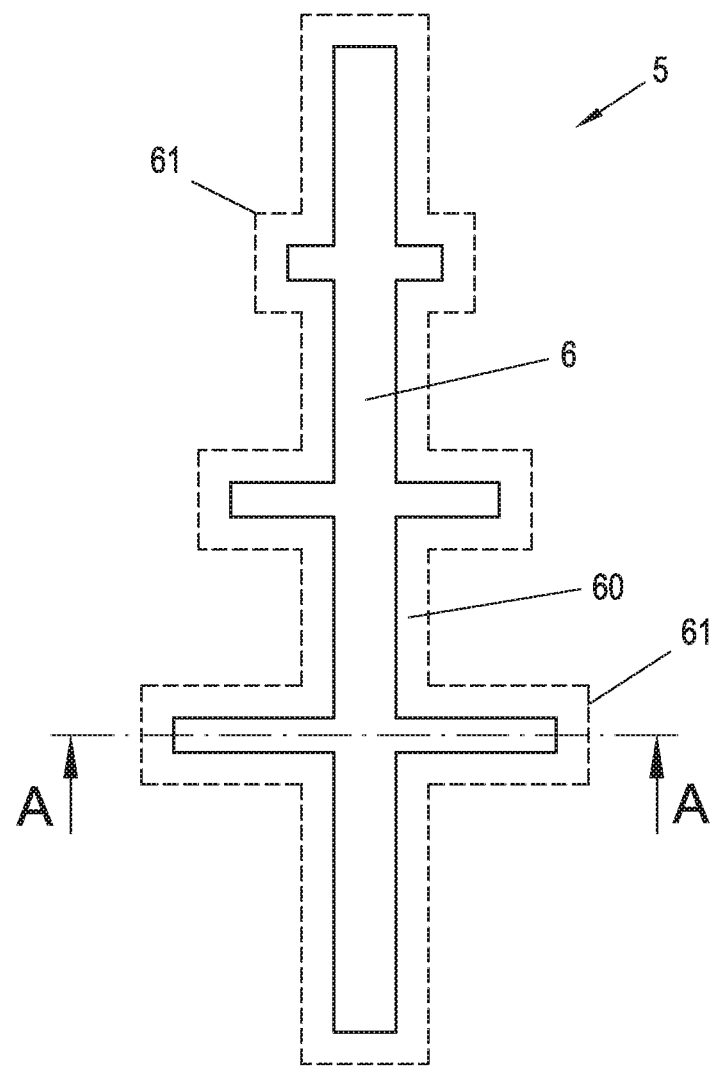
Figure 8:
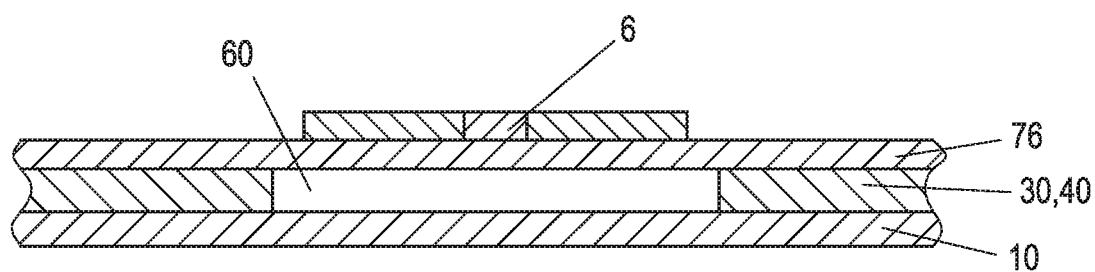

FIG. 3A or FIG. 3B to FIG. 6 each show in succession different production steps details of the manufacture of an intermediate printed circuit board product with an antenna structure, wherein FIG. 3A and FIG. 4A refer to a first alternative manufacturing method and FIG. 3B and FIG. 4B refer to an alternative second method of manufacture;

FIG. 3A shows in a sectional view along a vertical plane a ground layer comprising a release layer that is removable positioned on an antenna subarea of an exterior side of the ground layer;

FIG. 4A illustrates in an isometric and partly sectional view the step of attaching a dielectric insulating layer and a conducting layer on the exterior side of the ground layer that is partly covered by the release layer before laminating the layers to receive a first semi-finished product;

FIG. 3B shows in a sectional view along a vertical plane a ground layer without release layer;

FIG. 4B illustrates in an isometric and partly sectional view the step of attaching a dielectric insulating layer and a conducting layer on the exterior side of the ground layer before laminating the layers to receive a first semi-finished product, wherein recesses within the dielectric insulating layer and the conducting layer are stacked in a coextensive way to form an antenna cavity;

FIG. 5 shows in an isometric and partly sectional view the laminated first semi-finished product with an antenna cavity;

FIG. 6 illustrates in a sectional view along a vertical plane the intermediate printed circuit board product wherein the antenna cavity is covered by a compound signal layer;

FIG. 7 shows in a top view a detail of an antenna structure of another embodiment of an intermediate printed circuit board according to the invention;

FIG. 8 depicts a sectional view according to sectional plane A-A as marked in FIG. 7.

Figure 9:
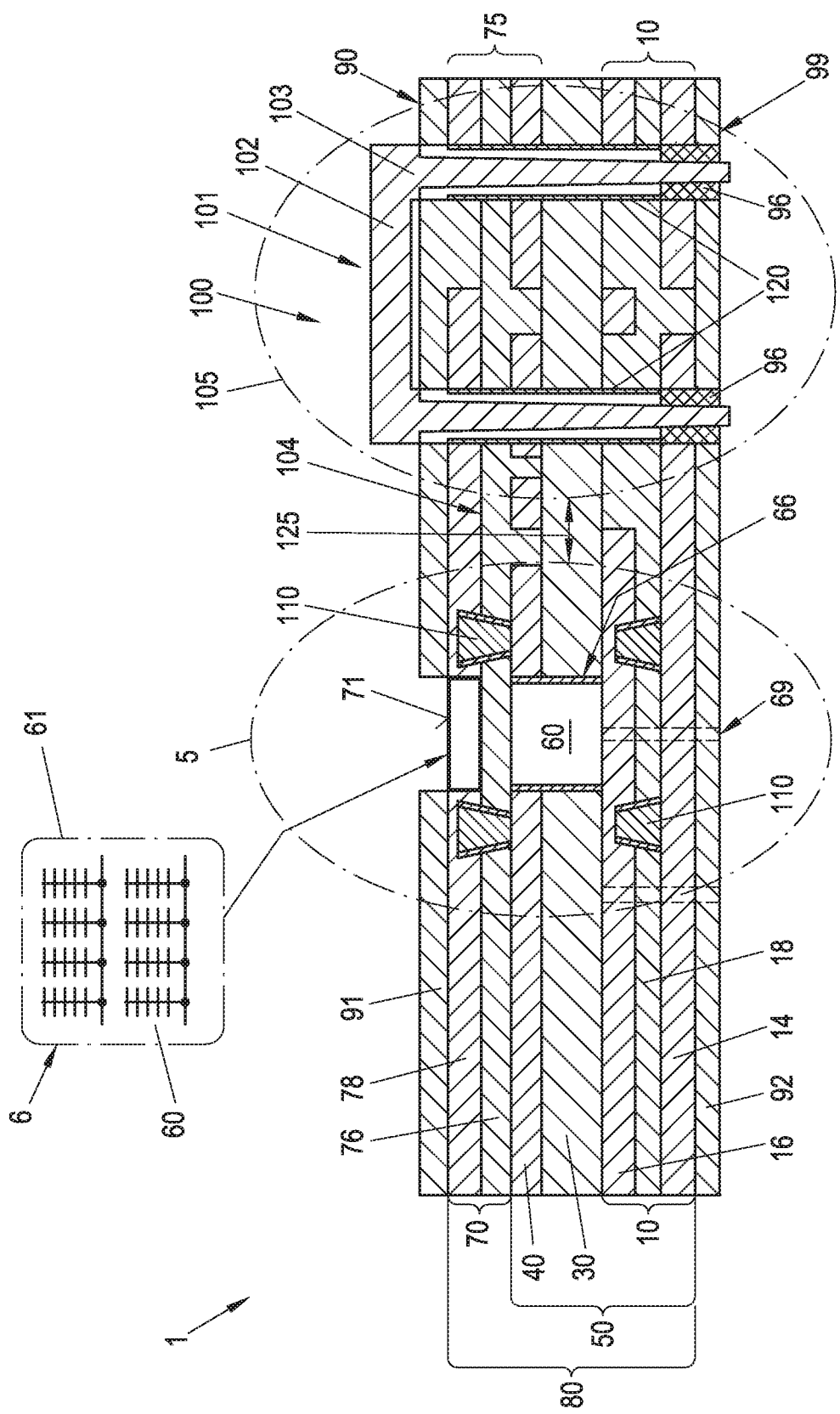

FIG. 9 is a sectional view of another embodiment of a printed circuit board according to the invention, comprising a surface-mounted signal processing unit that is connected with the ground layer of the printed circuit board by through holes.

Figure 10:
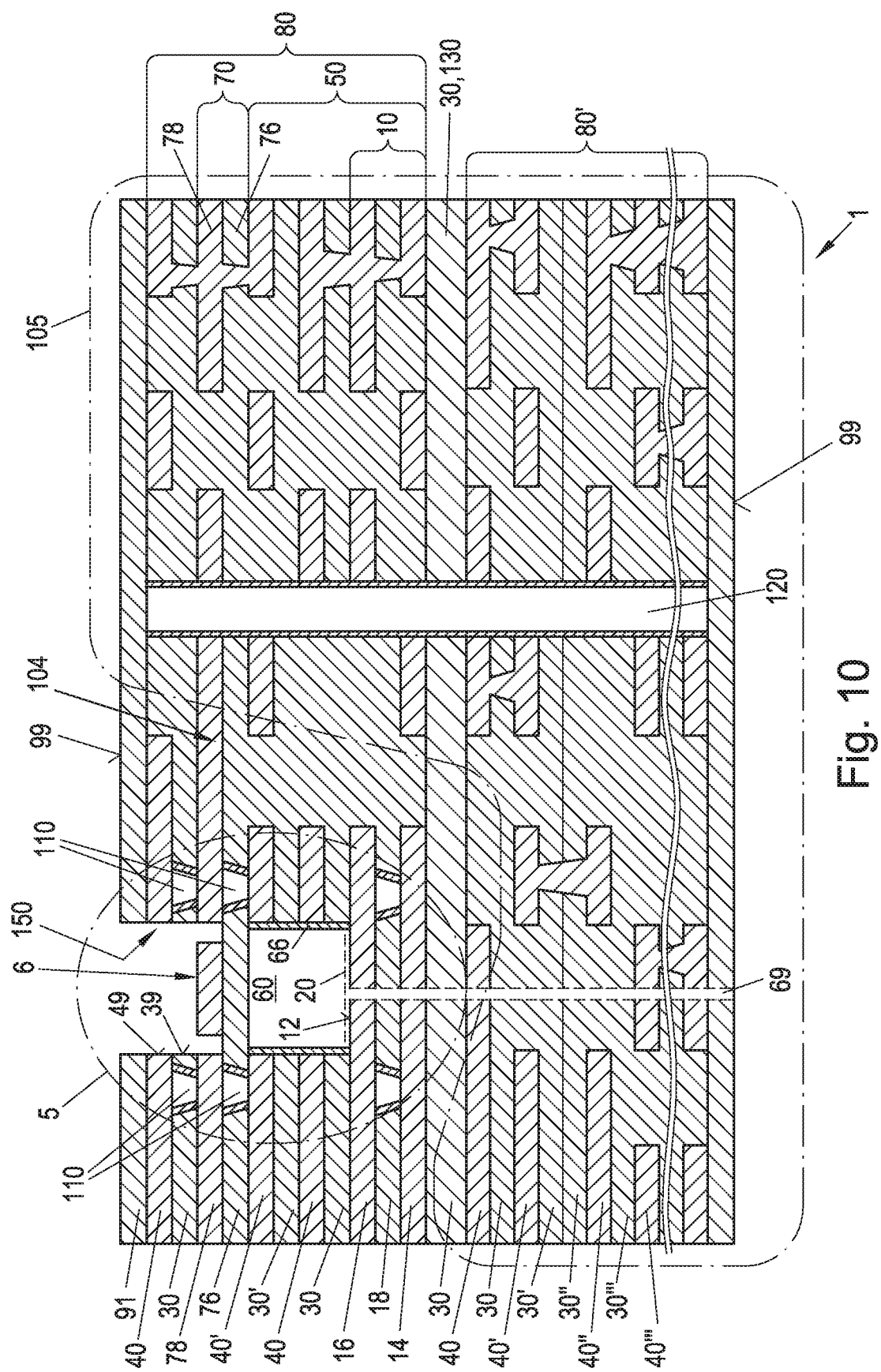

FIG. 10 is a sectional view of an alternative embodiment of a printed circuit board according to the invention with HDI (high-density interconnect) any-layer design.

In the schematic drawings enclosed, conducting layers are for ease of understanding most commonly shown as flat continuous conducting layers—except for those drawings where explicitly conducting paths of already structured conducting layers are shown that are connected by vias. Thus those drawings showing schematically continuous conducting layers without structured conducting paths and without respective vias, micro-vias, plated through-holes and the like to connect the conducting layers, do not illustrate their electrical function that is per se known to those skilled in the art. It is also known to the skilled person how to design and to structure conducting layers to receive the appropriate conducting paths according to the particular tasks. Main purpose of the drawings is to illustrate in a schematic way the respective layer structure during the production of an intermediate printed circuit board product according to the invention. It is emphasized that the drawings are not true to scale as for example the layer thickness of the conducting layers is shown at an enlarged scale compared to other layers like insulating layers. Also several parts or components are not depicted true to scale.

Figure 1:
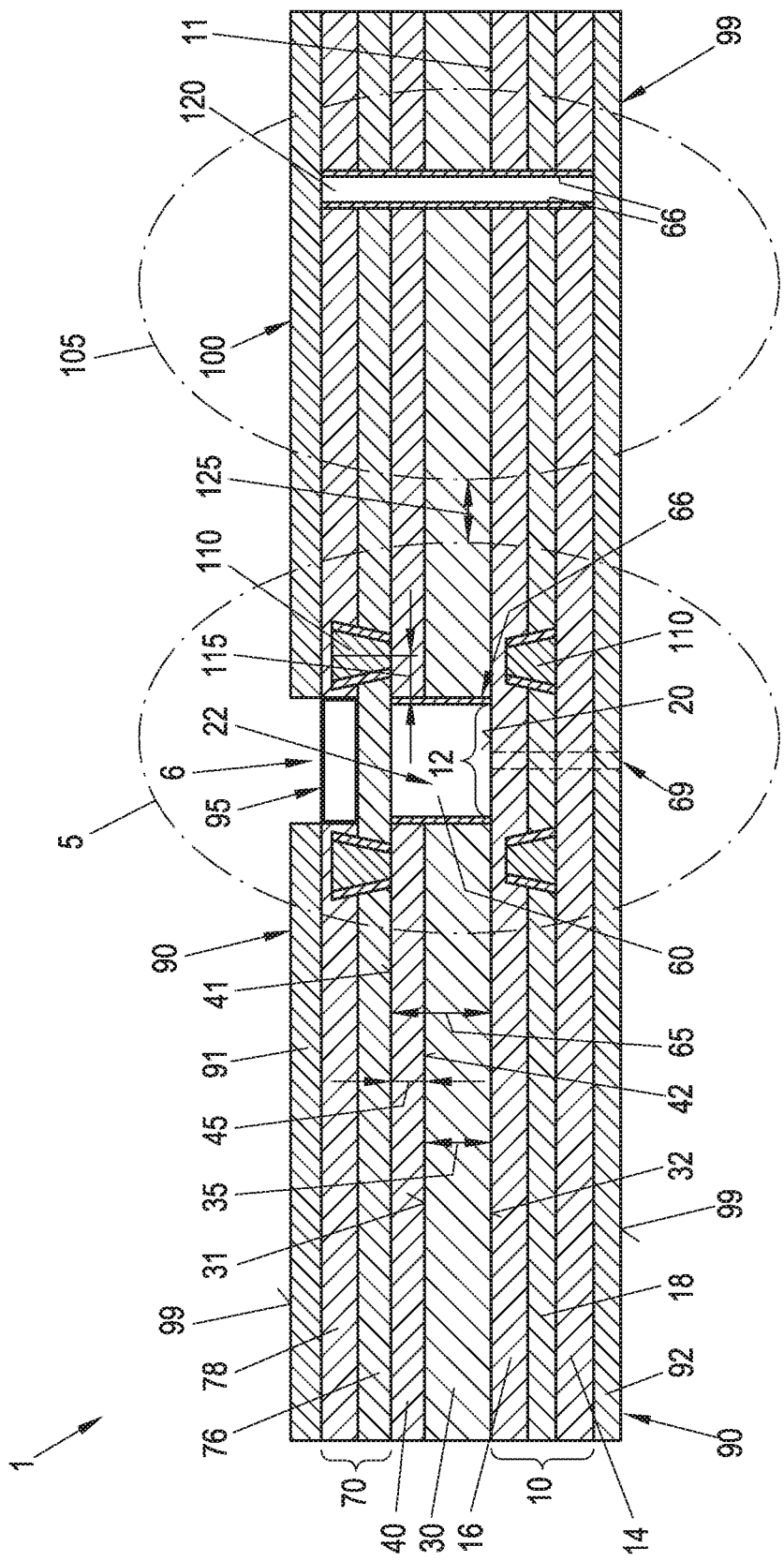
FIG. 1 is a sectional view along a vertical plane illustrating a first embodiment of a printed circuit board with an antenna structure as well as provided to be equipped with a digital processing structure according to the present invention.

With reference to FIG. 1, a preferred embodiment of a printed circuit board 1 with an antenna structure 5 is shown, wherein the antenna structure 5 comprises an antenna design area 6 as well as an antenna cavity 60. When producing the printed circuit board 1 according to the invention firstly a ground layer 10 with an exterior side 11 of the ground layer 10 is provided. The ground layer 10 comprises a first conducting metal layer 14, a second conducting metal layer 16 and an insulating layer 18, that is arranged and laminated between the conducting metal layers 14, 16. On the exterior side 11 of the ground layer within an antenna subarea 12 a release layer 20 is positioned, as can be seen in more detail in FIG. 3A.

FIG. 3A and FIG. 4A refer to details of individual stages of the first alternative manufacturing method as shown in FIG. 1 using an optional release layer 20 to obtain later on an antenna cavity with preferably exact outlines.

Back to FIG. 1 furthermore a dielectric insulating layer 30 with an exterior side 31 of the dielectric insulating layer 30 and a dielectric insulating layer height 35 is attached on the ground layer 10. On the exterior side 11 of the ground layer 10 that is partly covered by the release layer 20 the release layer 20 is arranged between the ground layer 10 and the dielectric insulating layer 30. Also a conducting layer 40 with a conducting layer height 45 is attached on the dielectric insulating layer 30 in a way that the dielectric insulating layer 30 is arranged between the conducting layer 40 and the ground layer 10.

Reference is made to FIG. 3A that shows the ground layer 10 in more detail. On the exterior side 11 of the ground layer within an antenna subarea 12 a release layer 20 is removable positioned. The position 22 of the release layer 20 on the exterior ground layer side 11 as well as the release layer shape 25 of the release layer 20 corresponds with the position and shape of the antenna cavity 60.

FIG. 4A illustrates the step of attaching a dielectric insulating layer 30 and a conducting layer 40 on the exterior side of the ground layer 10 that is partly covered by the release layer 20 before laminating the layers to receive a first semi-finished product 50. The first semi-finished product 50 comprises an exterior side 51 of the first semi-finished product 50 that is formed by the conducting layer.

Ensuing from the first embodiment of the production method as depicted in FIG. 4A, within the first semi-finished product 50 and starting on its exterior side 51 that is made up of the conducting layer 40 an antenna cavity 60 is manufactured for example via a laser cutting and/or deep routing process throughout the conducting layer 40 as well as the dielectric insulating layer 30 with a cavity height 65 equal to the sum of the conducting layer height 45 and the dielectric insulating layer height 35. A cavity projection area 61 of the antenna cavity 60 corresponds to the release layer shape 25 and the release layer position 22 as of the release layer 20 on the antenna subarea 12. FIG. 5 shows a groundplane area 62 of the antenna cavity 60 that is made up of the release layer 20. Due to the release layer 20 the cut-out and/or shaped-out material of the conducting layer 40 and dielectric insulating layer 30 can easily be taken out of the cavity projection area 61 to form the antenna cavity 60. Optionally the antenna cavity 60 can be coated with a metal coating 66 on its side walls 67, 68 as is shown in FIG. 1 and can be seen in more detail also in FIG. 5.

As depicted in FIG. 1, optionally a vent through-hole 69 can be drilled between the ground-plane area 62 of the antenna cavity 60 and an outer surface 99 of the printed circuit board 1. This vent through-hole 69 is manufactured as non-plated through hole and enhances pressure compensation between the interior of the antenna cavity 60 and the surrounding of the printed circuit board 1. Afterwards a compound signal layer 70 with an exterior side 71 of the signal layer 70 is attached on the exterior side 51 of the first semi-finished product 50 that is made up of the conducting layer 40. Thus the compound signal layer 70 covers the antenna cavity 60. After lamination of the compound signal layer 70 with the conducting layer 40 a compound antenna layer 75 is received comprising a dielectric no-flow prepreg layer 76 and a conducting metal layer 78 forming the compound signal layer 70 as well as the conducting layer 40.

After laminating the first semi-finished product 50 and the compound signal layer 70 an intermediate printed circuit board product 80 is received that is shown in more detail also in FIG. 6.

To receive a printed circuit board 1, afterwards solder masks 91, 92 are affixed on both exterior sides 81, 82 of the intermediate printed circuit board product 80 to apply structured solder layers 90 within recesses 95 of the solder masks 91, 92. The skilled person is perfectly acquainted with the technology how to apply solder layers as preparation for components that are later on mounted on the printed circuit board via soldering. Optionally the outer surfaces 99 are finished to receive a printed circuit board 1 with an antenna structure 5 as is illustrated in FIG. 1. In FIG. 1 the antenna structure 5 and a digital processing area 105 each are marked by dotted lines.

Figure 1A:
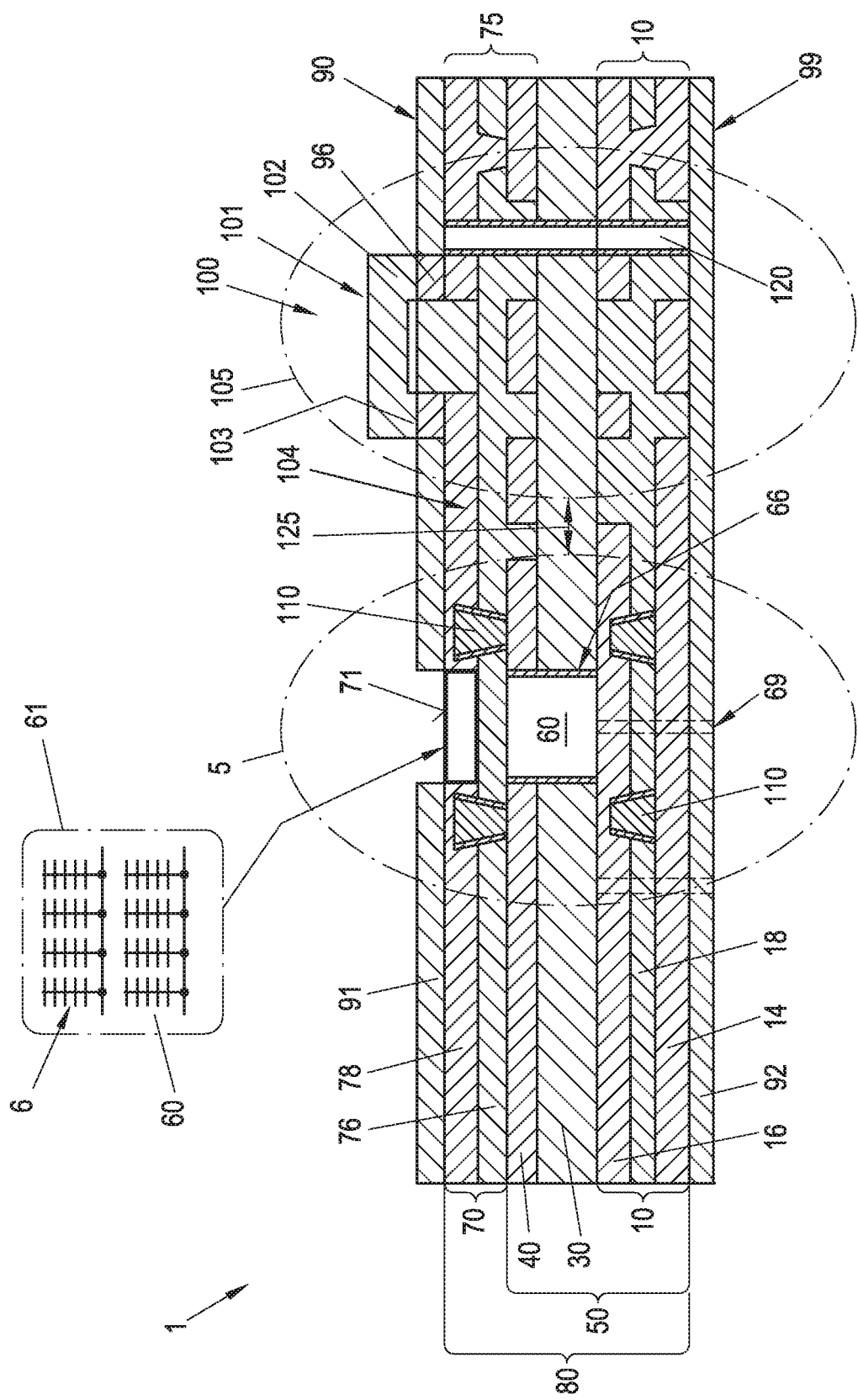
FIG. 1A is a sectional view of a printed circuit board obtained from the embodiment as shown in FIG. 1 with structured conducting paths and after assembling a surface-mounted signal processing unit.

FIG. 1A shows in a sectional view a printed circuit board 1 obtained from the embodiment as shown in FIG. 1 with structured conducting paths of conducting layers 14, 16, 40, 78 that are connected by vias according to their electrical function. In FIG. 1A also a surface-mounted signal processing unit 101 is already assembled within a digital processing area 105.

In FIG. 1A also an aerial view of the antenna design area 6 is inserted. The antenna design area 6 is arranged on an exterior side 71 of the compound signal layer 70 is illustrated as an insert surrounded by dotted lines that show the outer contour of the antenna cavity 60 beneath, which is the cavity projection area 61. A micro-via structure that is printed on the upper exterior side of the dielectric no-flow prepreg layer 76 is shown within the antenna design area 6. As can be seen the antenna stubs of the micro-via structure end in a distance to the cavity projection area 61.

Figure 1B:
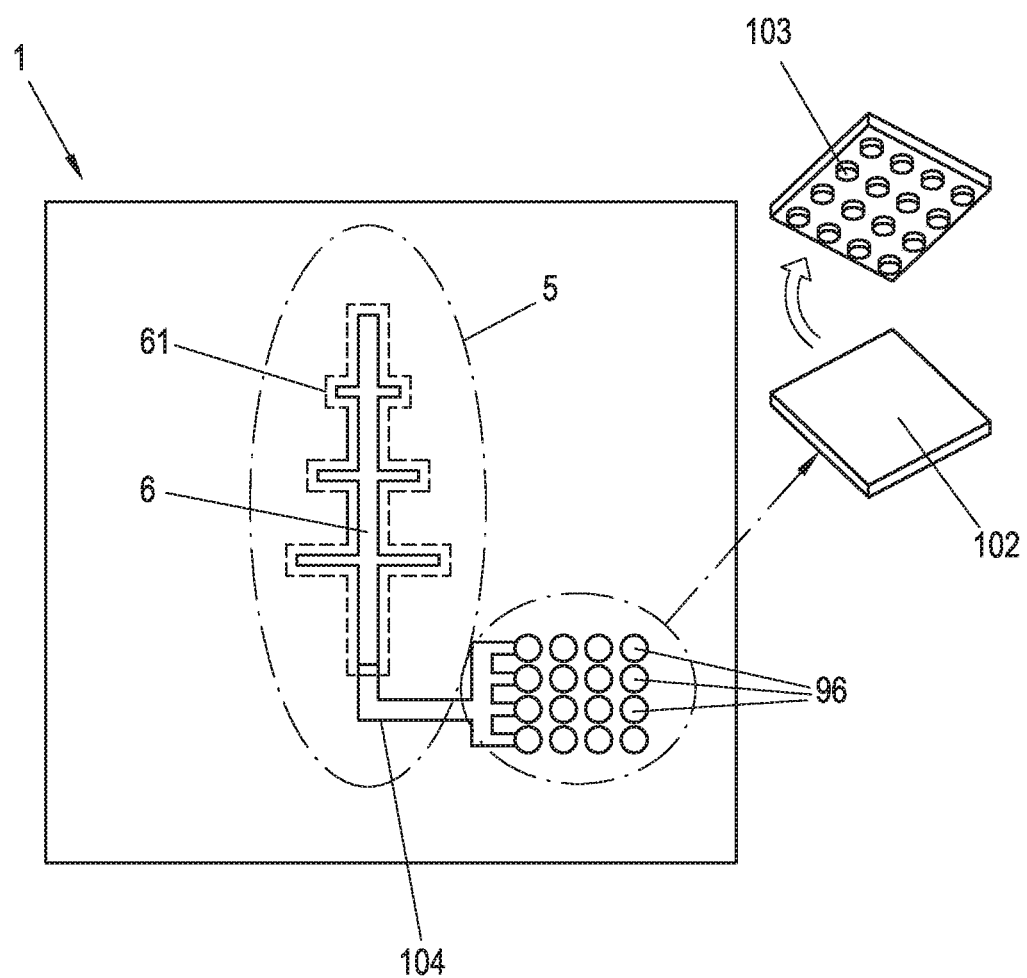
FIG. 1B is a top view of a detail of FIG. 1A.

FIG. 1B is a top view of a detail of FIG. 1A. In this embodiment a digital processing structure 100 is positioned within a digital processing area 105. The digital processing structure 100 comprises here a signal processing unit 101 with a radio frequency integrated circuit (RFIC) chip 102 that is already known in the art. The RFIC-chip 102 is mounted on the printed circuit board 1. The signal processing unit 101 is designed for analogue and digital signal processing of antenna signals and further comprises a radio frequency (RF) mixer that is integrated as a component within the RFIC chip 102. Here the RF mixer is used to convert a high-frequency antenna signal to a mediumfrequency signal that can be processed further in the signal processing unit 101. The signal processing unit 101 also comprises at least one filter, AD converter, decoder, amplifier, memory unit and/or power supply unit. The signal processing unit 101 is connected via an antenna signal line 104 with the antenna structure 5, which is adapted for high frequency antenna signals. For example here a microstrip line is used as antenna signal line 104. Several electrical functions can be realized by the circuitry according to the invention.

FIG. 1B illustrates that within an antenna structure 5 there is an antenna design area 6 realized on the upper exterior side 71 of the compound signal layer 70. The antenna design area 6 shows an antenna structure for example of a travelling wave antenna with a main line and several open stubs being arranged in a way that the open stubs end well before the side walls of the below antenna cavity 60. The below-lying antenna cavity 60 or the contour of its cavity projection area 61, respectively, is shown in FIG. 1B as dotdashed line. The distance between the antenna design area 6 and the cavity projection area 61 does not need to be a single, constant measure. Thus the shape of the antenna cavity 60 beneath and its cavity projection area 61, respectively, can also deviate from the contour of the micro-via structure of the antenna design area 6. An antenna signal line 104 connects the antenna design area 6 and the RFIC-chip 102 via solder pads 96 that are arranged here in a ball grid array (BGA) according to the position of respective interconnection pins 103 that are arranged on the bottom side of the RFIC-chip 102. The shown pins 103 are solder balls. BGA packages are used to permanently mount devices such as microprocessors. FIG. 1B shows the footprint of the ball grid array, while the RFIC-chip 102 is shown in a lifted position before being soldered with its pins 103 on the respective solder pads 96.

Components and/or parts of the signal processing unit 101 may be embedded especially within the same laminated ground layer 10, laminated dielectric insulating layer 30, conducting layer 40 as well as compound signal layer 70 in a distance 125 in regard to the antenna cavity 60.

The digital structure 100 comprises here also a plated through hole 120 passing through the intermediate printed circuit board product 80 from a first exterior side 81 of the intermediate printed circuit board product 80 to an opposite second exterior side 82. As shown exemplarily in FIG. 1, the side walls within the through hole 120 are covered with a coating 66. Additionally the antenna cavity 60 is surrounded by several shielding vias 110 that are arranged here within the laminated ground layer 10, the dielectric insulating layer 30, the conducting layer 40 as well as the compound signal layer 70 each in a distance 115 in regard to the antenna cavity 60.

Figure 2:
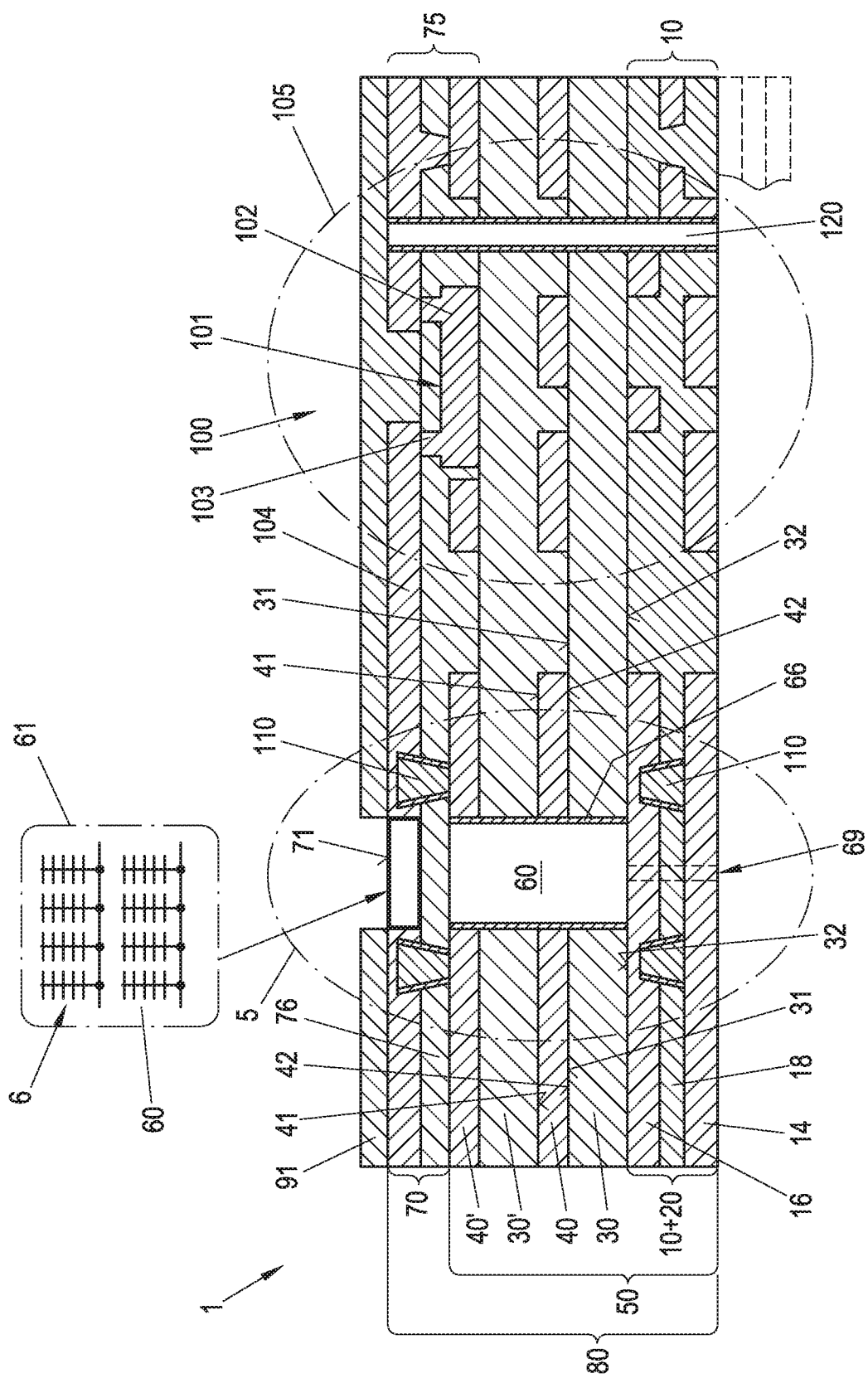
FIG. 2 shows a detail of another embodiment of a printed circuit board build-up according to the invention. In a sectional view along a vertical plane the several production steps to produce a printed circuit board with an antenna structure according to an alternative second inventive production method after structuring the conducting paths and assembling is illustrated.

FIG. 2 illustrates the several production steps to produce a printed circuit board 1 according to an alternative second inventive method without usage of a release layer. A signal processing unit 101 is already embedded within a digital processing area 105. Reference numbers are the same as in FIGS. 1 and 1A. Compared to FIG. 1, in FIG. 2 a further dielectric insulating layer 30' and a further conducting layer 40' are shown that are stacked alternatingly on top of the preceding layers 30, 40. As material for the dielectric insulating layers 30, 30' a standard FR-4 material is taken. Thus an enlarged antenna cavity 60 with an enlarged cavity height 65 is obtained. The printed circuit board 1 is shown with already structured conducting paths of conducting layers 14, 16, 40, 40', 78 according to their electrical function. The plurality of layers includes conductive planes with structured conducting paths that are connected by vias. Also the signal processing unit 101 is already assembled and contacted with the antenna design area 6 via an antenna signal line 104. The antenna signal line 104 is designed as short path within the conducting metal layer 78, thus on the same layer as the antenna contacts and the interconnection pins 6 of the embedded RFIC-chip 102 are positioned. As FIG. 2 shows only a detail of a sequential layer build-up of a printed circuit board 1, further layers that are comprised in this build-up are indicated via dashed lines only.

FIG. 3B and FIG. 4B refer to details of individual stages of the second alternative method of manufacture without using a release layer comparable with FIG. 2. In FIG. 3B a ground layer 10 without release layer is shown. FIG. 4B illustrates in an isometric and partly sectional view the step of attaching a first dielectric insulating layer 30 and a first conducting layer 40 on the exterior side 11 of the ground layer 10 before optionally stacking up further dielectric insulating layers 30' and conducting layers 40' in an alternating arrangement. These further layers 30' and 40' are not shown in FIG. 4B. After arranging these layers 30, 40, 30', 40' together with the ground layer 10, the stack of layers 10, 30, 40, 30', 40' is laminated to receive a first semi-finished product 50, wherein recesses 39, 39' within the dielectric insulating layers 30, 30' and respective recesses 49, 49' within the conducting layers 40, 40' are stacked in a coextensive way to form an antenna cavity 60.

A first semi-finished product 50 as shown in FIG. 5 can be easily derived by laminating the respective layers 10, 30, 40. As mentioned previously, also further layer arrangements like pairs of dielectric insulating layers 30' and conducting layers 40', that are stacked alternatingly, can be laminated together with the preceding layers to obtain a multi-layered semi-finished product 50.

FIG. 7 shows in a top view a detail of an antenna structure 5 of another embodiment of an intermediate printed circuit board 1 according to the invention.

FIG. 8 depicts a sectional view according to sectional plane A-A as marked in FIG. 7. The antenna design area 6 has here a complex, tree-like shape. The respective antenna cavity 60 underneath has an enlarged shape comparable to that of the antenna design area 6. Thus the cavity projection area 61 of the antenna cavity 60 is larger than the antenna design area 6. The antenna stubs of the micro-via structure end in a distance to the cavity projection area 61. It is emphasized that said distance between the antenna design area 6 and the cavity projection area 61 does not need to be a single, constant measure. Thus the shape of the antenna cavity 60 beneath does not have to be in exact equidistance in regard to the micro-via structure of the antenna design area 6. The antenna is here attached to the dielectric no-flow prepreg layer 76. Advantageously the cavity height 65 of the antenna cavity 60 can be adjusted depending on the number of stacked-up layers 30, 40. The antenna cavity 60 is made for example via a laser cutting process wherein the applicants' 2.5D technology is applied.

FIG. 9 is a sectional view of another embodiment of a printed circuit board 1 according to the invention, comprising a surface-mounted signal processing unit 101 that is connected with the ground layer 10 of the printed circuit board 1 by through holes 120. The layer wise build-up as shown in FIG. 9 is the same as previously described in FIGS. 1 and 1A. Also the respective reference numbers are the same as previously used and refer to the same items. In FIG. 9 the conducting paths are already structured and are connected by vias. The interconnection pins 103 of a surface-mounted RFIC-chip 102 are connected within plated through holes 120 and solder pads 96 to the ground layer 10. The through holes 120 pass through all layers of the printed circuit board 1. As antenna signal line 104 a microstrip line is used which is designed as short connection between the antenna structure 5 and the digital processing structure 100.

FIG. 10 illustrates another alternative embodiment of a printed circuit board 1 according to the invention with a HDI (high-density interconnect) any-layer design. This embodiment includes a plurality of layers including conducting layers connected by vias. Here in this embodiment the electrical connections between the individual layers mainly consist of laser-drilled microvias. The main advantage of this technology is that all the layers can be freely interconnected. In general laser-drilled microvias electroplated with copper are used. This printed circuit board 1 is manufactured for example according to a sequential layer build-up (SBU). Thus manufacture is started with a core (double sided or an insulator), with conductive and dielectric layers formed one after the other on both sides of the board. This technology also allows blind vias to be created during the build-up process, and discrete or formed components to be embedded.

To illustrate manufacture of the upper intermediate printed circuit board product 80 with an antenna structure 5 as shown in the upper part of FIG. 10, the following steps have to be taken to obtain this upper part. The upper part is shown in FIG. 10 above the core material 130 in the middle that is taken as starting material. According to SBU technique applied for this manufacture, it is obvious for the skilled person that layer wise build-up is formed one after the other on both sides of the core material 130 simultaneously. Thus description of the lower part, which are the layers that are shown in FIG. 10 below the core material 130, will follow later on. Back to the main manufacture steps of the upper intermediate printed circuit board product 80:

- As starting material a core material 130 is provided. The core material 130 is here a dielectric insulating layer 30.
- A ground layer 10 that is made up of a first conducting metal layer 14, an insulating layer 18 and a second conducting metal layer 16 is attached to the core material 130.
- A release layer 20 with a release layer shape is positioned on one exterior side of the ground layer 10, wherein the release layer 20 is removably positioned on an antenna subarea 12 of the exterior side 11 of the ground layer 10.
- A first dielectric insulating layer 30 is attached on one exterior side of the ground layer 10 that is partly covered by the release layer 20, wherein the release layer 20 is arranged between the ground layer 10 and the dielectric insulating layer 30.
- A first conducting layer 40 on a first exterior side of the dielectric insulating layer 30 opposite to the ground layer 10 wherein the dielectric insulating layer 30 is arranged between the conducting layer 40 and the ground layer 10.

A layer arrangement of a further dielectric insulating layer 30' and a further conducting layer 40' is attached, whereby the further dielectric insulating layer 30' is attached on said conducting layer 40 and the further conducting layer 40' is attached on the further dielectric insulating layer 30'.

The ground layer 10, the dielectric insulating layers 30 and 30', the conducting layers 40 and 40' and the release layer 20 are here laminated layer-wise and after that a first semi-finished product 50 is obtained.

An antenna cavity 60 is manufactured via laser-cutting within the first semi-finished product 50 starting on its exterior side that is made up of the upper conducting layer 40' and that extends throughout the conducting layers 40, 40' as well as the dielectric insulating layers 30, 30'. The cavity height of the antenna cavity 60 is equal to the sum of the respective layer heights. Thus a cavity projection area that corresponds to the release layer shape can be obtained, wherein the ground-plane area of the cavity is covered by the release layer 20. After manufacturing the antenna cavity 60 it can be opened like a plug by peeling off the release layer 30. This manufacturing feature is also known as 2.5D technology developed by the applicant.

The side walls within the antenna cavity 60 are metallized with a copper coating 66.

A compound signal layer 70 is attached on the exterior side made up of the upper conducting layer 40' of the first semi-finished product 50, wherein the compound signal layer 70 covers the antenna cavity 60. The compound signal layer 70 comprises a dielectric no-flow prepreg layer 76 and a conducting metal layer 78.

The first semi-finished product 50 and the compound signal layer 70 are laminated together.

The antenna design area 6 is structured on the upper side of the dielectric no-flow prepreg layer 76—made of the conducting metal layer 78 material.

A layer arrangement of a further dielectric insulating layer 30 and a further conducting layer 40 are stacked up on the compound signal layer 70 and are laminated and the intermediate printed circuit board product 80 is obtained.

The further dielectric insulating layer 30 and the further conducting layer 40 both have recesses 39, 49 that are in registry with the antenna cavity 60 beneath the compound signal layer 70. Thus an antenna recess 150 is formed. To be able to form a recess 39 with exact side walls, usage of a low-flow material or no-flow material as further dielectric insulating layer 30 is preferred. Alternatively the antenna recess 150 could also be manufactured via 2.5D technology developed by the applicant.

Optionally side walls within the antenna recess 150 can be metallized and have for example a copper coating.

As can also be seen in FIG. 10, shielding vias 110 are manufactured and are arranged within the printed circuit board product 1 in a distance 115 in regard to the antenna cavity 60. Further shielding vias 110 are arranged within the printed circuit board 1 close to the antenna recess 150.

In regard to the lower part that is shown in FIG. 10 below the core material 130: As said before according to SBU technique applied for this manufacture, layer wise build-up is formed one after the other on both sides of the core material 130 simultaneously. As depicted also the lower part which is indicated here as intermediate printed circuit board product 80', comprises a layer arrangement of insulating layers 30, 30', 30", 30''' and of conducting layers 40, 40', 40", 40''' that are attached accordingly. The multi-layer build up is laminated.

Structured solder masks 91 are applied on both exterior sides of the multi-layer build-up. A vent through-hole 69 is manufactured between the ground-plane area of the cavity 60 and the lower exterior side of the multi-layer build-up. Thus a pressure compensation can take place between the inside pressure within the air gap of the antenna cavity 60 and the surrounding pressure outside of the PCB. Also a plated through hole 120 is shown that runs through printed circuit board 1.

Not shown in FIG. 10 is the assembly of a RFIC-chip on already prepared solder pads 96 that are connected via a HF antenna signal line 104 to the antenna structure 5. The antenna signal line 104 is positioned on the upper side of the dielectric no-flow prepreg layer 76 and is structured together with the antenna design area 6 within the same manufacturing step. The RFIC-chip in this embodiment will be surface-mounted within the digital processing area 105 on the upper exterior side of the printed circuit board 1. Afterwards the outer surfaces 99 are finished to obtain a finished printed circuit board 1 with an antenna structure 5 according to the invention. Alternatively or in addition to a RFIC-chip that is surface mounted close to the antenna cavity 60, further parts or components of the signal processing unit can be surface-mounted and/or embedded within the marked digital processing area 105. Also not shown in FIG. 10 are possible further antenna structures 5 comprising antenna cavities 60 that may be arranged within the upper part 80 and/or the lower part 80' of the printed circuit board 1.

LIST OF ABBREVIATIONS 1 printed circuit board
5 antenna structure
6 antenna design area
10 ground layer
11 exterior side of ground layer
12 antenna subarea
14 (first) conducting metal layer
16 (second) conducting metal layer
16' further conducting metal layer
18 insulating layer
18' further insulating layer
20 release layer
22 position of release layer on exterior ground layer side
25 release layer shape
30 dielectric insulating layer
30' further dielectric insulating layer (30", etc.)
31 first (upper) exterior side of dielectric insulating layer
32 second (lower) exterior side of dielectric insulating layer
35 dielectric insulating layer height
39 recess within dielectric insulating layer
40 conducting layer
40' further conducting layer (40", etc.)
41 first (upper) exterior side of conducting layer
42 second (lower) exterior side of conducting layer
45 conducting layer height
49 recess within conducting layer
50 (first) semi-finished product
51 exterior side of first semi-finished product
60 antenna cavity
61 cavity projection area
62 ground-plane area of antenna cavity
65 cavity height 66 coating
67 side wall within antenna cavity
68 side wall within antenna cavity
69 vent through-hole
70 compound signal layer
71 exterior side of signal layer
75 compound antenna layer
76 dielectric no-flow prepreg layer
78 conducting metal layer
80 intermediate printed circuit board product
81 (first) exterior side of intermediate printed circuit board product
82 (second) exterior side of intermediate printed circuit board product
90 solder layer
91 solder mask on (first) exterior side of intermediate printed circuit board product
92 solder mask on (second) exterior side of intermediate printed circuit board product
95 recess within solder mask
96 solder pad
99 outer surface of printed circuit board
100 digital processing structure
101 signal processing unit
102 RFIC-chip
103 interconnection pin
104 antenna signal line
105 digital processing area
110 shielding via
115 distance between shielding via and antenna cavity
120 plated through hole
125 distance between antenna cavity and digital processing structure
130 core material
150 antenna recess

The invention claimed is:

1. A method for producing an intermediate printed circuit board product (80) with an antenna structure (5), comprising the following steps:

providing a ground layer (10);
optionally attaching a release layer (20) with a release layer shape (25) on one exterior side (11) of the ground layer (10), wherein the release layer (20) is removably positioned (22) on an antenna subarea (12) of the exterior side (11) of the ground layer (10);
attaching a dielectric insulating layer (30) on one exterior side (11) of the ground layer (10) that is if applicable partly covered by the release layer (20), wherein the release layer (20) is arranged between the ground layer (10) and the dielectric insulating layer (30);
attaching a conducting layer (40) on a first exterior side (31) of the dielectric insulating layer (30) opposite to the ground layer (10) wherein the dielectric insulating layer (30) is arranged between the conducting layer (40) and the ground layer (10);
laminating of the ground layer (10), the at least one dielectric insulating layer (30, 30'), the at least one conducting layer (40, 40') and if applicable the release layer (20) and
optionally attaching a layer arrangement on a first exterior side (41) of said conducting layer (40), said layer arrangement comprising at least one further dielectric insulating layer (30', 30") and at least one further conducting layer (40', 40"), whereby at least one further dielectric insulating layer (30') is attached on said first exterior side (41) of the conducting layer (40) and at least one further conducting layer (40') is attached on a first exterior side (31) of at least one further dielectric insulating layer (30', 30"), to obtain a first semi-finished product (50);
manufacturing of at least one antenna cavity (60) within the first semi-finished product (50) starting on its exterior side (51) that is made up of the at least one conducting layer (40, 40') and extending throughout at least one conducting layer (40) as well as at least one dielectric insulating layer (30) with a cavity height (65) equal to the sum of at least one conducting layer height (45) and at least one dielectric insulating layer height (35), wherein if applicable a cavity projection area (61) corresponds to the release layer shape (25) and is positioned (22) on the antenna subarea (12) covered by the release layer (20) and wherein a ground-plane area (62) of the cavity (60) is made up of the release layer (20);
optionally coating (66) of the side walls (67, 68) within the antenna cavity (60);
attaching a compound signal layer (70) on the exterior side (51) made up of the conducting layer (40) of the first semi-finished product (50), wherein the compound signal layer (70) covers the antenna cavity (60); and
laminating of the first semi-finished product (50) and the compound signal layer (70) to obtain an intermediate printed circuit board product (80).

2. The method of claim 1, wherein the compound signal layer (70) comprises a dielectric no-flow prepreg layer (76) and a conducting metal layer (78) directly attached to the dielectric no-flow prepreg layer (76) wherein the dielectric no-flow prepreg layer (76) is attached to a conducting layer (40) of the first semi-finished product (50).

3. The method of claim 1, wherein the ground layer (10) is made of a laminated compound layer comprising at least two conducting metal layers (14, 16) laminated with an insulating layer (18) in between the at least two conducting metal layers (14, 16), where optionally a layer arrangement comprising at least one further insulating layer (18') and at least one further conducting metal layer (16') is stacked up and is laminated with the preceding layers to form the laminated compound layer.

4. The method of claim 1, wherein the antenna cavity (60) has a vent through-hole (69) arranged between the ground-plane area (62) of the cavity (60) and an exterior side (82) of the intermediate printed circuit board product (80).

5. The method of claim 1, wherein the antenna cavity (60) is surrounded with shielding vias (110) that are arranged within the laminated ground layer (10) and/or at least one dielectric insulating layer (30) and/or at least one conducting layer (40) and/or compound signal layer (70) in a distance (115) in regard to the antenna cavity (60).

6. The method of claim 1, wherein the antenna structure (5) comprises an antenna design area (6) that is arranged on an exterior side (71) of the compound signal layer (70).

7. The method of claim 1, wherein a digital processing area (105) with a digital processing structure (100) comprising at least one signal processing unit (101) is mounted on or embedded within the intermediate printed circuit board product (80) in a distance (125) in regard to the antenna cavity (60), whereby the signal processing unit (101) is connected via at least one antenna signal line (104) with the antenna structure (5) and is designed for analogue and digital signal processing of antenna signals.

8. The method of claim 1, wherein solder masks (91, 92) are affixed on one or both exterior sides (81, 82) of one intermediate printed circuit board product (80) or on one or both exterior sides (81, 82) of at least two previously interconnected and stacked-up intermediate printed circuit board products (80).

9. A method for producing an intermediate printed circuit board product (80) with an antenna structure (5), comprising the following steps:
- providing a ground layer (10);
- attaching a dielectric insulating layer (30) on one exterior side (11) of the ground layer (10), wherein the dielectric insulating layer (30) has at least one recess (39) extending throughout the dielectric insulating layer height (35) of the dielectric insulating layer (30), and wherein the at least one recess (39) is positioned on an antenna subarea (12) of the exterior side (11) of the ground layer (10);
- attaching a conducting layer (40) on a first exterior side (31) of the dielectric insulating layer (30) opposite to the ground layer (10), wherein the dielectric insulating layer (30) is arranged between the conducting layer (40) and the ground layer (10), and wherein the conducting layer (40) preferably has at least one recess (49) extending throughout the conducting layer height (45) of the conducting layer (40) which at least one recess (49) is positioned coextensive with the at least one recess (39) of the dielectric insulating layer (30);
- laminating of the ground layer (10), the at least one dielectric insulating layer (30) and the at least one conducting layer (40) and
- optionally attaching a layer arrangement on a first exterior side (41) of said conducting layer (40), said layer arrangement comprising at least one further dielectric insulating layer (30', 30") and at least one further conducting layer (40', 40"), whereby at least one further dielectric insulating layer (30', 30") is attached on said first exterior side (41) of the conducting layer (40) and at least one further conducting layer (40') is attached on a first exterior side (31) of at least one further dielectric insulating layer (30'), and wherein preferably at least one further dielectric insulating layer (30', 30") and at least one further conducting layer (40', 40") has at least one recess (39, 49) that is positioned in registry with at least one of the preceding recesses (39, 49) as well as in registry with an antenna subarea (12) on the exterior side (11) of the ground layer (10), to obtain a first semi-finished product (50);
- receiving at least one antenna cavity (60) within the first semi-finished product (50) starting on its exterior side (51) that is made up of the recess (49) of at least one conducting layer (40) as well as the coextensive recess (39) of at least one dielectric insulating layer (30), the at least one antenna cavity (60) comprising a cavity height (65) equal to the sum of at least one conducting layer height (45) and at least one dielectric insulating layer height (35), wherein a cavity projection area (65) of the antenna cavity (60) is positioned (22) on the antenna subarea (12);
- optionally coating (66) of the side walls (67, 68) within the antenna cavity (60);
- attaching a compound signal layer (70) on the exterior side (51) made up of the conducting layer (40) of the first semi-finished product (50), wherein the compound signal layer (70) covers the at least one antenna cavity (60); and
- laminating of the first semi-finished product (50) and the compound signal layer (70) to obtain an intermediate printed circuit board product (80).

10. The method of claim 9, wherein the compound signal layer (70) comprises a dielectric no-flow prepreg layer (76) and a conducting metal layer (78) directly attached to the dielectric no-flow prepreg layer (76) wherein the dielectric no-flow prepreg layer (76) is attached to a conducting layer (40) of the first semi-finished product (50).

11. The method of claim 9, wherein the ground layer (10) is made of a laminated compound layer comprising at least two conducting metal layers (14, 16) laminated with an insulating layer (18) in between the at least two conducting metal layers (14, 16), where optionally a layer arrangement comprising at least one further insulating layer (18') and at least one further conducting metal layer (16') is stacked up and is laminated with the preceding layers to form the laminated compound layer.

12. The method of claim 9, wherein the antenna cavity (60) has a vent through-hole (69) arranged between the ground-plane area (62) of the cavity (60) and an exterior side (82) of the intermediate printed circuit board product (80).

13. The method of claim 9, wherein the antenna cavity (60) is surrounded with shielding vias (110) that are arranged within the laminated ground layer (10) and/or at least one dielectric insulating layer (30) and/or at least one conducting layer (40) and/or compound signal layer (70) in a distance (115) in regard to the antenna cavity (60).

14. The method of claim 9, wherein the antenna structure (5) comprises an antenna design area (6) that is arranged on an exterior side (71) of the compound signal layer (70).

15. The method of claim 9, wherein a digital processing area (105) with a digital processing structure (100) comprising at least one signal processing unit (101) is mounted on or embedded within the intermediate printed circuit board product (80) in a distance (125) in regard to the antenna cavity (60), whereby the signal processing unit (101) is connected via at least one antenna signal line (104) with the antenna structure (5) and is designed for analogue and digital signal processing of antenna signals.

16. The method of claim 9, wherein solder masks (91, 92) are affixed on one or both exterior sides (81, 82) of one intermediate printed circuit board product (80) or on one or both exterior sides (81, 82) of at least two previously interconnected and stacked-up intermediate printed circuit board products (80).

17. An intermediate printed circuit board product (80) with an antenna structure (5), wherein at least one antenna cavity (60) is arranged within a first semi-finished product (50) comprising:
- at least one ground layer (10);
- at least one dielectric insulating layer (30) which is attached to the ground layer (10); and
- at least one conducting layer (40) which is attached to the dielectric insulating layer (30) opposite to the ground layer (10) in a way that the at least one dielectric insulating layer (30) is arranged between the at least one conducting layer (40) and the ground layer (10), whereby the ground layer (10), the at least one dielectric insulating layer (30) and the at least one conducting layer (40) are laminated, and
- wherein the antenna cavity (60) touches the ground layer (10) alongside a ground-plane area (62) and extends throughout the at least one conducting layer (40) as well as the at least one dielectric insulating layer (30) with a cavity height (65) equal to the sum of at least one conducting layer height (45) and of at least one dielectric insulating layer height (35), wherein a compound signal layer (70) is attached on the conducting layer (40) of the first semi-finished product (50) covering the antenna cavity (60), and the first semi-finished product (50) and the compound signal layer (70) are laminated.

18. The intermediate printed circuit board product (80) of claim 17, wherein the antenna cavity (60) is surrounded with shielding vias (110) that are arranged within the ground layer (10) and/or dielectric insulating layer (30) and/or conducting layer (40) and/or compound signal layer (70) in a distance (115) to the antenna cavity (60).

19. The intermediate printed circuit board product (80) of claim 17, wherein the compound signal layer (70) comprises a dielectric no-flow prepreg layer (76) and a conducting metal layer (78) directly attached to the dielectric no-flow prepreg layer (76) wherein the dielectric no-flow prepreg layer (76) is attached to a conducting layer (40) of the first semi-finished product (50).

20. The intermediate printed circuit board product (80) of claim 17, wherein a digital processing area (105) with a digital processing structure (100) comprising at least one signal processing unit (101) that is mounted on or embedded within the intermediate printed circuit board product (80) in a distance (125) to the antenna cavity (60), whereby the processing unit (101) is connected via at least one antenna signal line (104) with the antenna structure (5) and is designed for analogue and digital signal processing of antenna signals.

21. The intermediate printed circuit board product (80) of claim 17, wherein at least one antenna cavity (60) has a vent through-hole (69) starting from the ground-plane area (62) and passing throughout the laminated ground layer (10).

22. A printed circuit board (1) with an antenna structure (5) comprising:
- at least one intermediate printed circuit board product (80) of claim 17; and
- a solder mask (91, 92) applied on one or both exterior sides (81, 82) of the at least one intermediate printed circuit board product (80) or on one or both exterior sides (81, 82) of at least two previously interconnected and stacked-up intermediate printed circuit board products (80).

* * * * *